US009711415B2

United States Patent
Lin et al.

(10) Patent No.: US 9,711,415 B2
(45) Date of Patent: *Jul. 18, 2017

(54) DEVICE FOR HIGH-K AND METAL GATE STACKS

(75) Inventors: Jyun-Ming Lin, Hsinchu (TW); Wei Cheng Wu, Zhubei (TW); Sheng-Chen Chung, Jhubei (TW); Bao-Ru Young, Zhubei (TW); Hak-Lay Chuang, Singapore (SG)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/469,645

(22) Filed: May 11, 2012

(65) Prior Publication Data
US 2013/0299913 A1   Nov. 14, 2013

(51) Int. Cl.
*H01L 21/8238*   (2006.01)

(52) U.S. Cl.
CPC ............... *H01L 21/823842* (2013.01); *H01L 21/823857* (2013.01)

(58) Field of Classification Search
CPC ............. H01L 21/4763; H01L 21/8234; H01L 21/82345; H01L 21/823462; H01L 21/8238; H01L 21/823842; H01L 21/823857; H01L 29/40; H01L 21/022
USPC ....... 257/364, 369, 379, 380, 392, 411, 412, 257/E27.046, E27.06, E27.07, E29.255; 438/199, 200, 216, 275, 287
See application file for complete search history.

(56) References Cited

U.S. PATENT DOCUMENTS

| | | | | |
|---|---|---|---|---|
| 7,071,122 B2* | 7/2006 | Saenger | ........... | H01L 21/28194 257/E21.25 |
| 8,008,143 B2* | 8/2011 | Hsu | ................... | H01L 21/82345 438/183 |
| 8,698,252 B2* | 4/2014 | Chen et al. | ................... | 257/379 |
| 2010/0038721 A1* | 2/2010 | Lin et al. | ...................... | 257/369 |
| 2010/0096705 A1 | 4/2010 | Hung et al. | | |
| 2010/0148262 A1* | 6/2010 | Stahrenberg et al. | ........ | 257/350 |
| 2010/0178772 A1* | 7/2010 | Lin et al. | ...................... | 438/703 |
| 2010/0285658 A1* | 11/2010 | Yeh | ................... | H01L 21/82381 438/586 |
| 2011/0073964 A1* | 3/2011 | Chowdhury et al. | ......... | 257/411 |
| 2012/0139062 A1* | 6/2012 | Yuan | ................. | H01L 21/76897 257/411 |

OTHER PUBLICATIONS

Unpublished U.S. Appl. No. 13/456,939, filed Apr. 26, 2012 entitled "Device and Methods for High-K and Metal Gate Stacks," 33 pages.
(Continued)

*Primary Examiner* — Matthew Landau
*Assistant Examiner* — Mark Hatzilambrou
(74) *Attorney, Agent, or Firm* — Haynes and Boone, LLP

(57) ABSTRACT

A semiconductor device having five gate stacks on different regions of a substrate and methods of making the same are described. The device includes a semiconductor substrate and isolation features to separate the different regions on the substrate. The different regions include a p-type field-effect transistor (pFET) core region, an input/output pFET (pFET IO) region, an n-type field-effect transistor (nFET) core region, an input/output nFET (nFET IO) region, and a high-resistor region.

16 Claims, 16 Drawing Sheets

(56) References Cited

OTHER PUBLICATIONS

Unpublished U.S. Appl. No. 13/457,079, filed Apr. 26, 2012 entitled "Device and Methods for High-K and Metal Gate Stacks," 33 pages.
Taiwanese Office Action dated May 20, 2015 regarding Patent Application No. 102116634 filed Dec. 31, 2009.

* cited by examiner

DEVICE FOR HIGH-K AND METAL GATE STACKS

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Field effect transistors (FETs) have been used in conventional IC design. Due to shrinking technology nodes, high-k (HK) dielectric material and metal are often considered to form a gate stack for a FET. Integration issues exist when forming various HK/metal-gate (MG) FETs onto a single IC chip, such as a HK/MG of p-type FET core, n-type FET core, input/output nFET, input/output pFET, and high-resistor. Thus, a process that provides flexibility and feasibility to fabricate various HK/MG structures is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
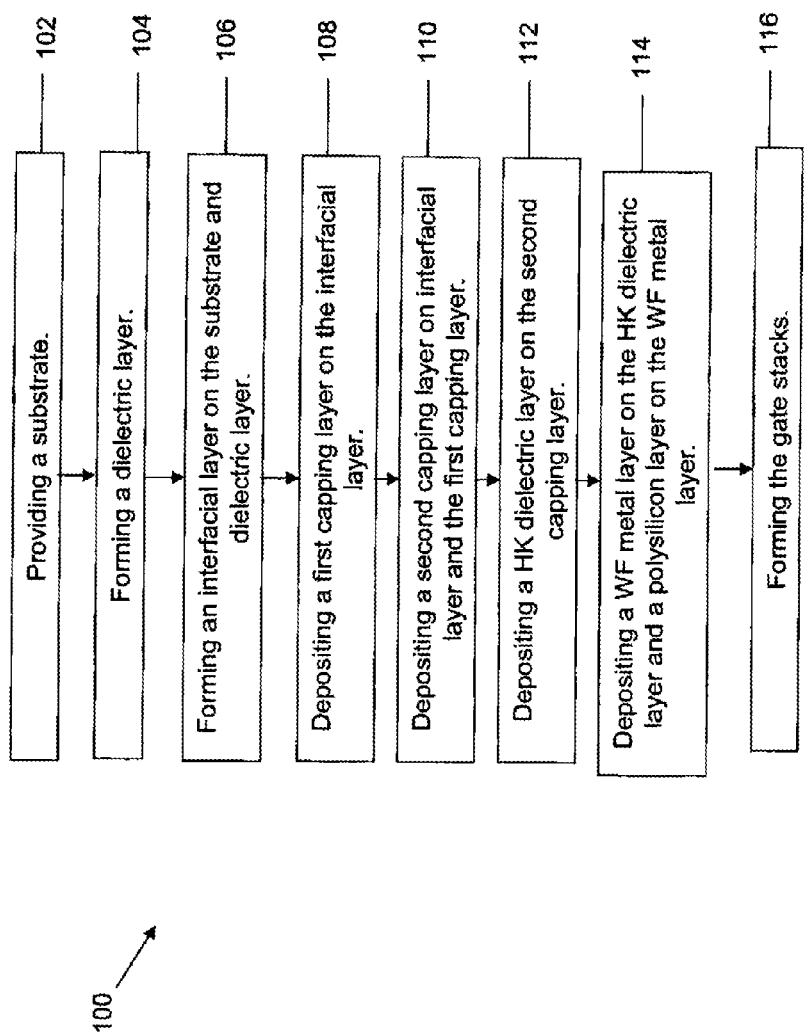
FIG. 1 is a flowchart of a method for making a semiconductor device having various gate stacks in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 13:
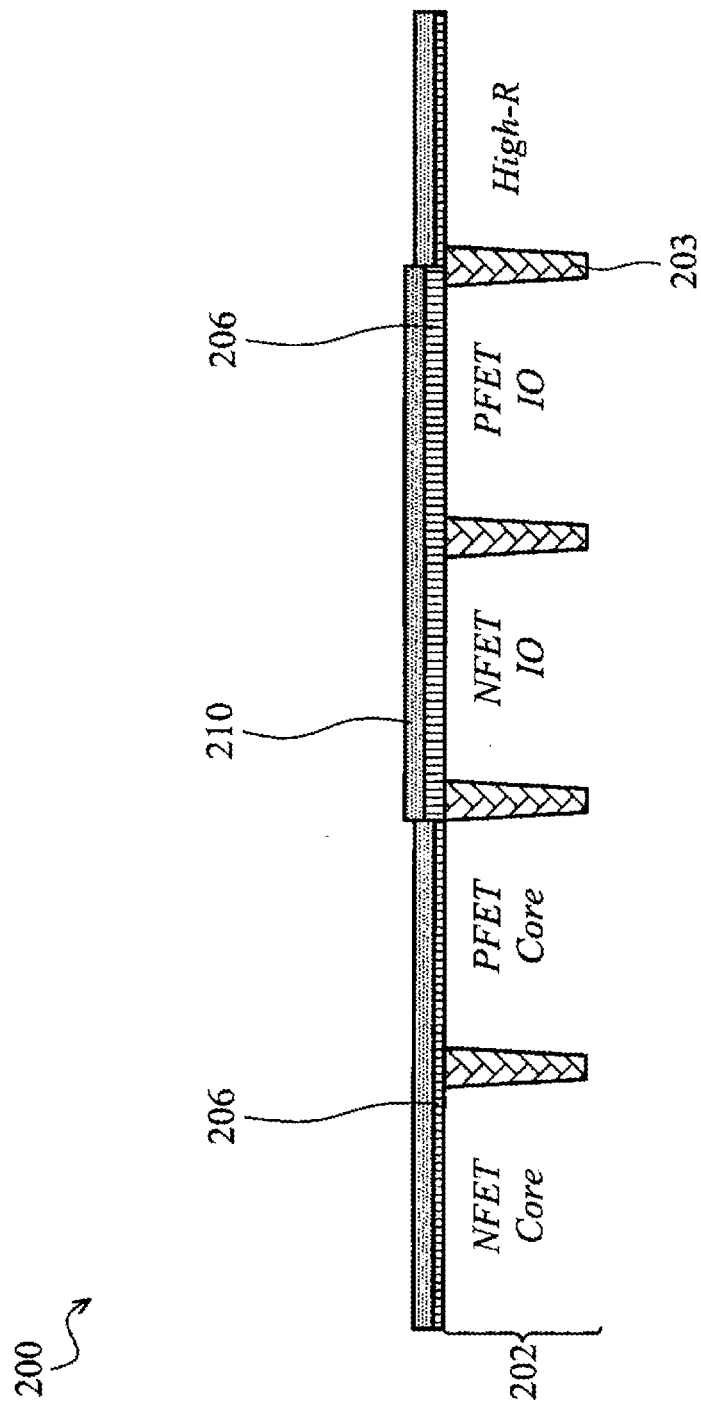
FIGS. 13-14 are sectional views of yet another embodiment of a semiconductor device having various gate stacks at various fabrication stages constructed according to various aspects of the present disclosure.
Figure 14:
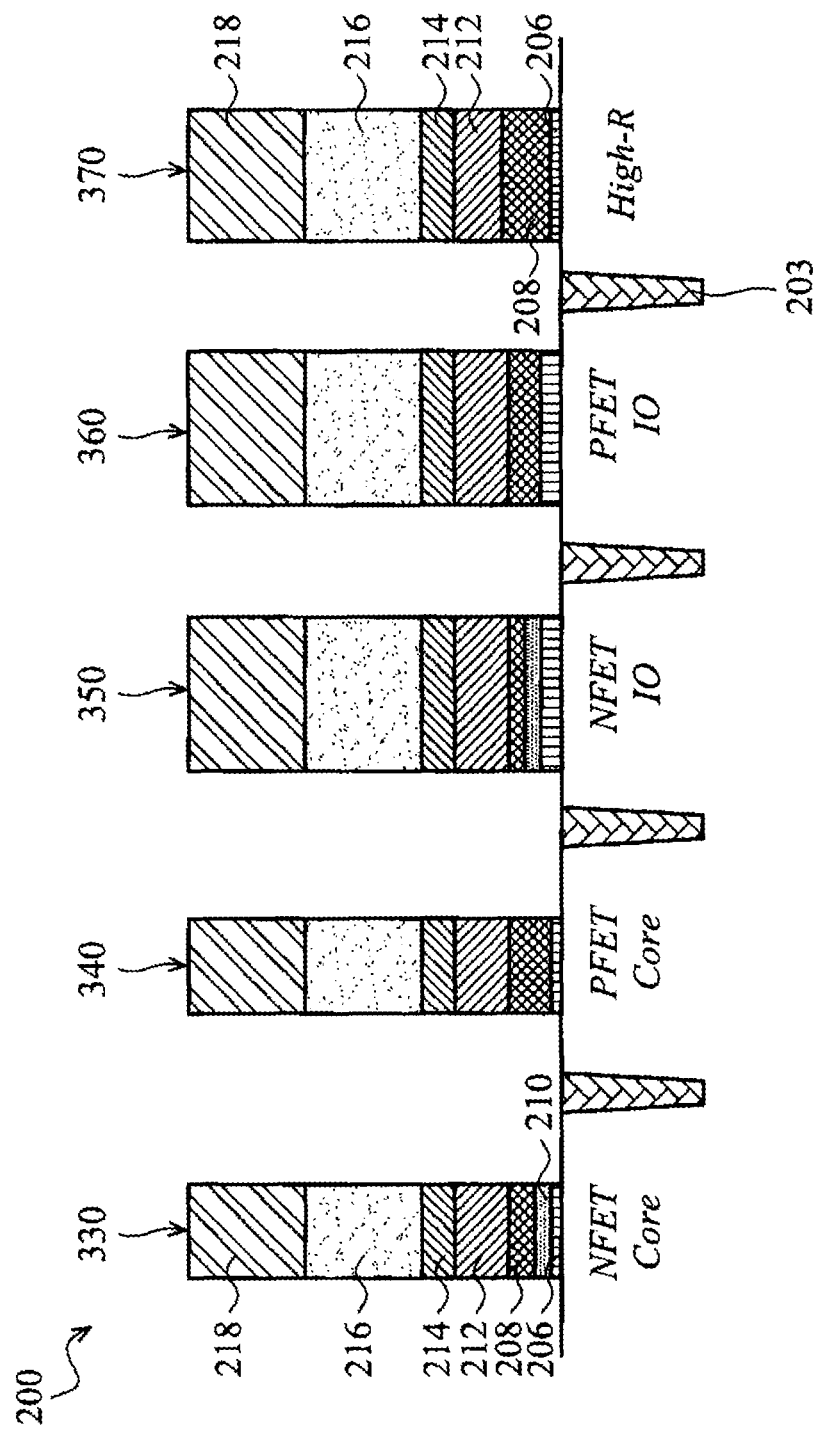
Figure 15:
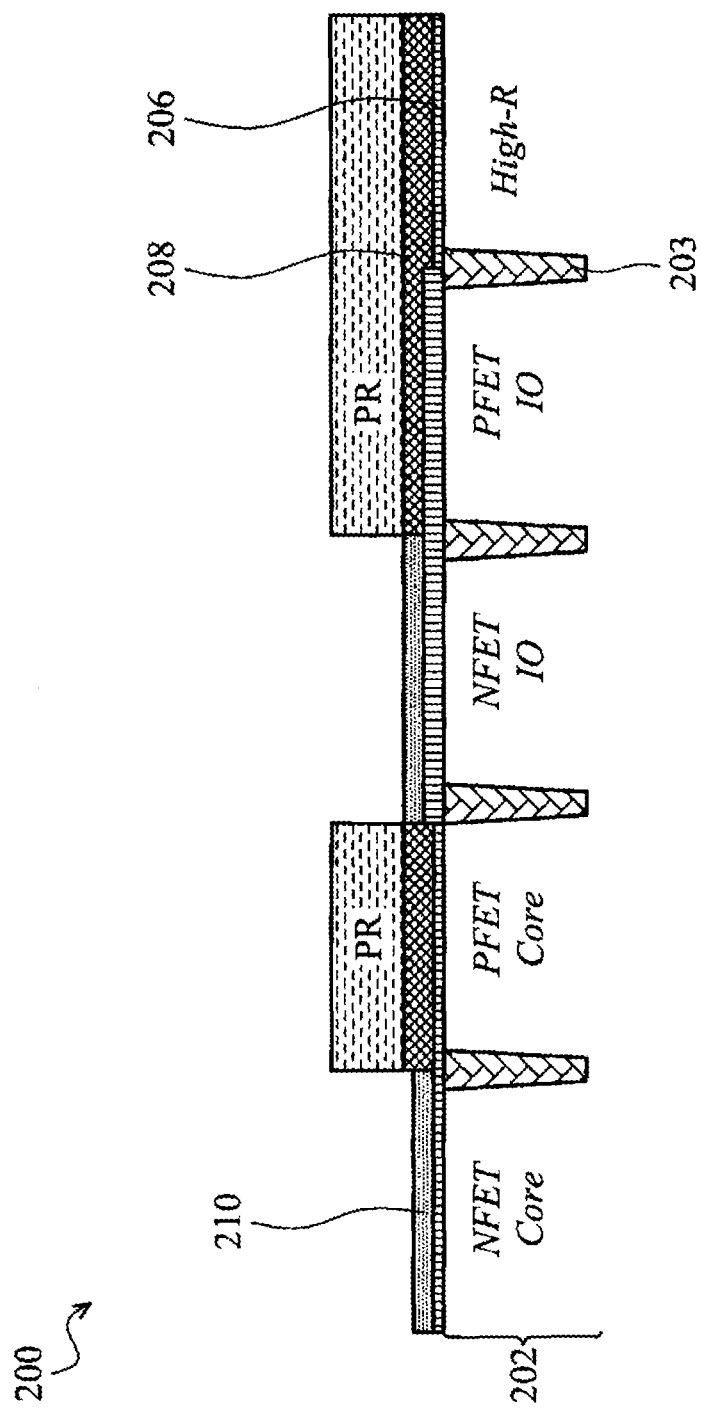
FIGS. 15-16 are sectional views of one more embodiment of a semiconductor device having various gate stacks at various fabrication stages constructed according to various aspects of the present disclosure.
Figure 16:
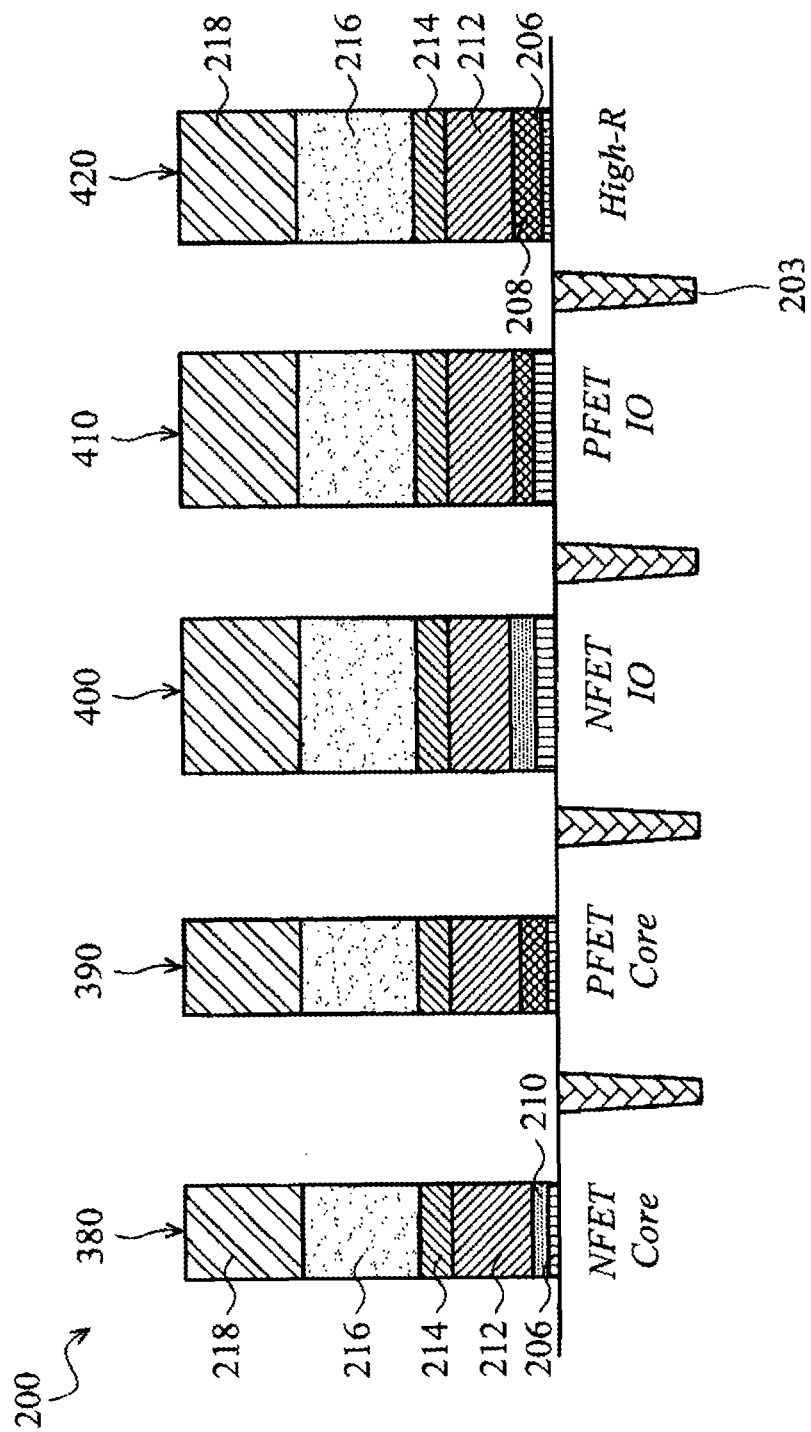

FIG. 1 is a flowchart of one embodiment of a method 100 making a semiconductor device having gate stacks constructed according to aspects of the present disclosure. FIGS. 2-8 are sectional views of one embodiment of a semiconductor device 200 having gate stacks at various fabrication stages. FIGS. 9-12 are sectional view of another embodiment of a semiconductor device 200. FIGS. 13-14 are sectional views of yet another embodiment of a semiconductor device 200. FIGS. 15-16 are sectional views of a one more embodiment of a semiconductor device. The semiconductor device 200 and the method 100 of making the same are collectively described with reference to FIGS. 1 through 16.

The method 100 begins at step 102 by providing a semiconductor substrate 202. The semiconductor substrate 202 includes silicon. Alternatively, the substrate 202 includes germanium or silicon germanium. Also alternatively, the semiconductor substrate 202 may include an epitaxial layer. For example, the semiconductor substrate 202 may have an epitaxial layer overlying a bulk semiconductor. Further, the semiconductor substrate 202 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the semiconductor substrate 202 may include a semiconductor-on-insulator (SOI) structure. Also alternatively, the semiconductor substrate 202 may include a buried dielectric layer, such as a buried oxide (BOX) layer, such as that formed by separation by implantation of oxygen (SIMOX) technology, wafer bonding, SEG, or other appropriate method.

The semiconductor substrate 202 also includes various doped regions such as n-well and p-wells formed by a proper technique, such as ion implantation. The semiconductor substrate also 202 includes various isolation features, such as shallow trench isolation (STI) 203, formed in the substrate to separate various device regions. The formation of the STI 203 may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI 203 may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

The semiconductor substrate 202 includes various device regions. The various device regions include various n-type and p-type field effect transistors and one or more resistors. In the present embodiment, the semiconductor substrate 202 includes an n-type field-effect transistor (nFET) core region, an input/output nFET (nFET IO) region, a p-type field-effect transistor (pFET) core region, an input/output pFET (pFET IO) region, and a high-resistor region.

Figure 2:
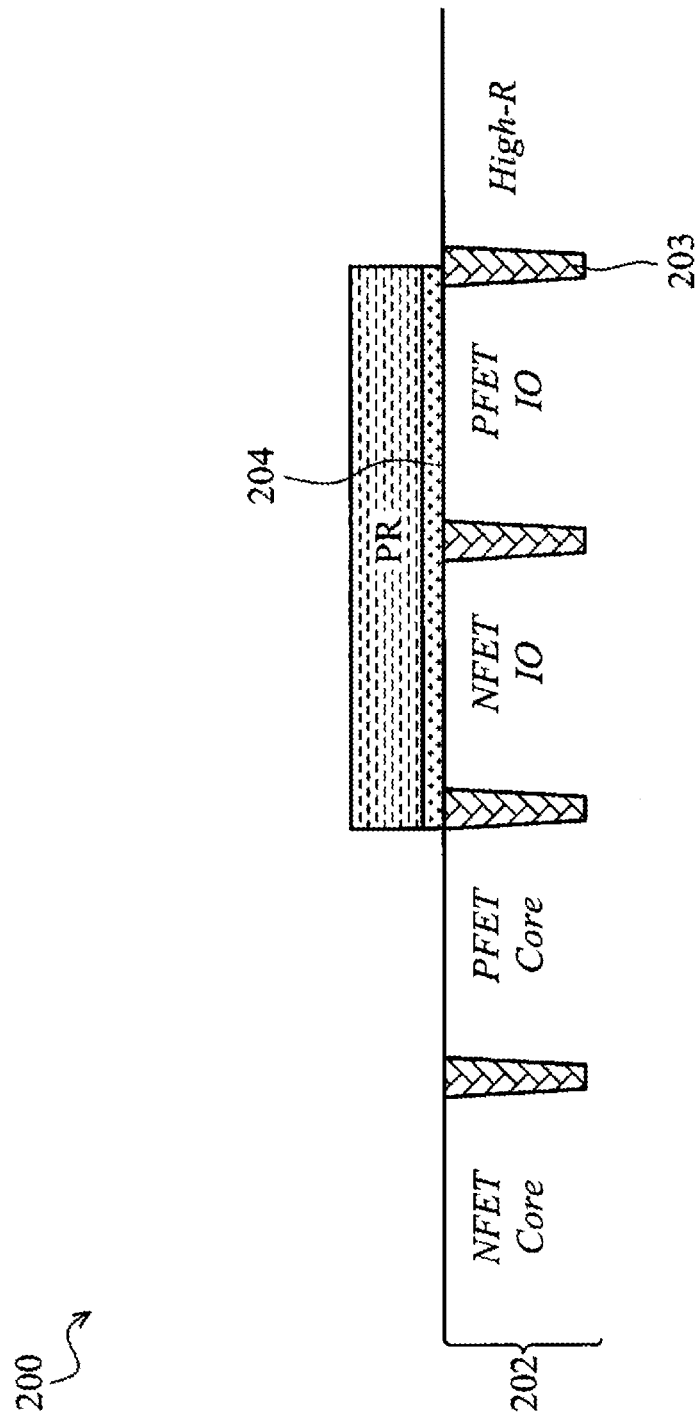
FIGS. 2-8 are sectional views of one embodiment of a semiconductor device having various gate stacks at various fabrication stages constructed according to various aspects of the present disclosure.

Referring to FIG. 2, the method 100 proceeds to step 104 by forming a dielectric layer 204 on the input/output regions of the semiconductor substrate 202 by suitable techniques, such as depositing, photoresist patterning and etching processes. The dielectric layer 204 includes chemical oxide, or any other suitable materials. In the next step 106, an interfacial layer 206 is formed on the substrate 202 and the dielectric layer 204 (not shown). The interfacial layer 206 may include silicon oxide formed by a proper technique, such as an atomic layer deposition (ALD), thermal oxidation, UV-Ozone Oxidation, or chemical vapor deposition (CVD).

Figure 3:
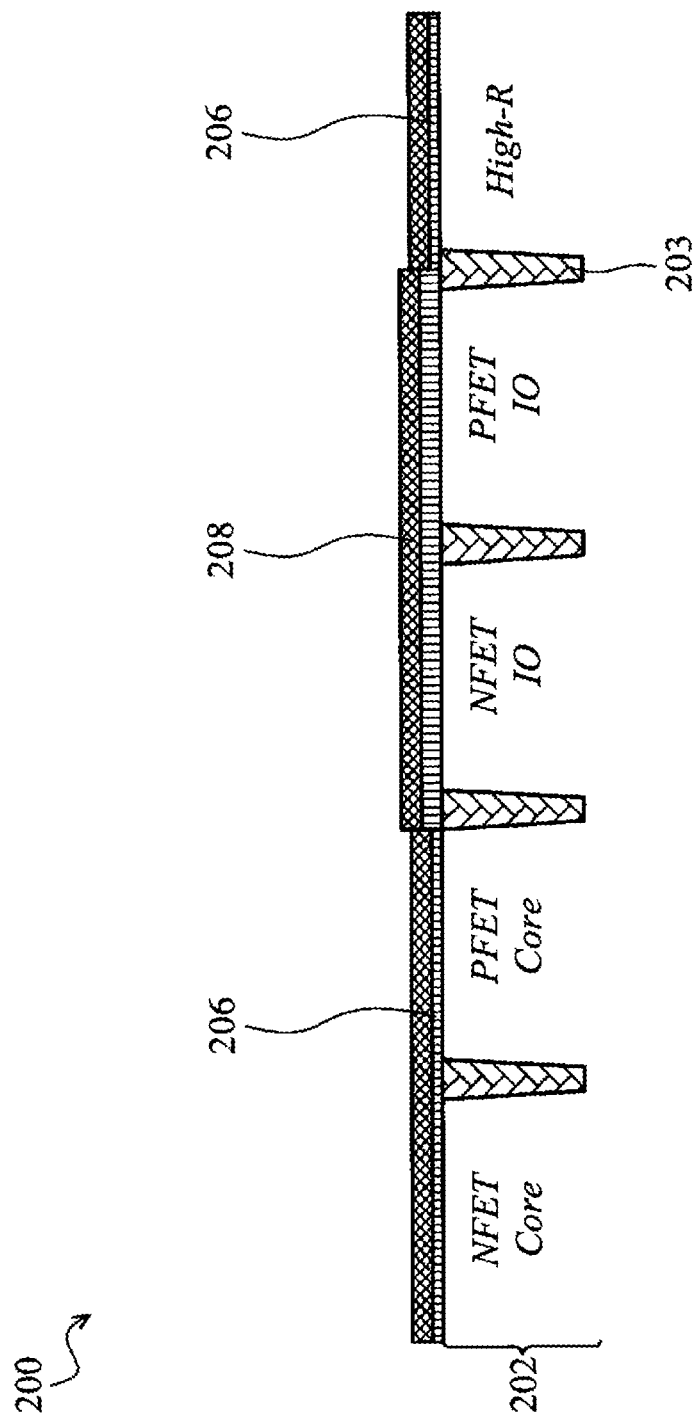

Moving to FIG. 3, in step 108, a capping layer of a first material 208 is deposited on the interfacial layer 206. The capping layer 208 may include a p-type work function metal or metal oxide, including $Al_2O_3$, MgO, CaO, or mixtures thereof. In the present embodiment, capping layer 208 includes aluminum oxide. The capping layer 208 is formed by a suitable technique, such as ALD, CVD, or physical vapor deposition (PVD). In one embodiment, the capping layer 208 has a thickness of less than 50 angstroms.

Figure 4:
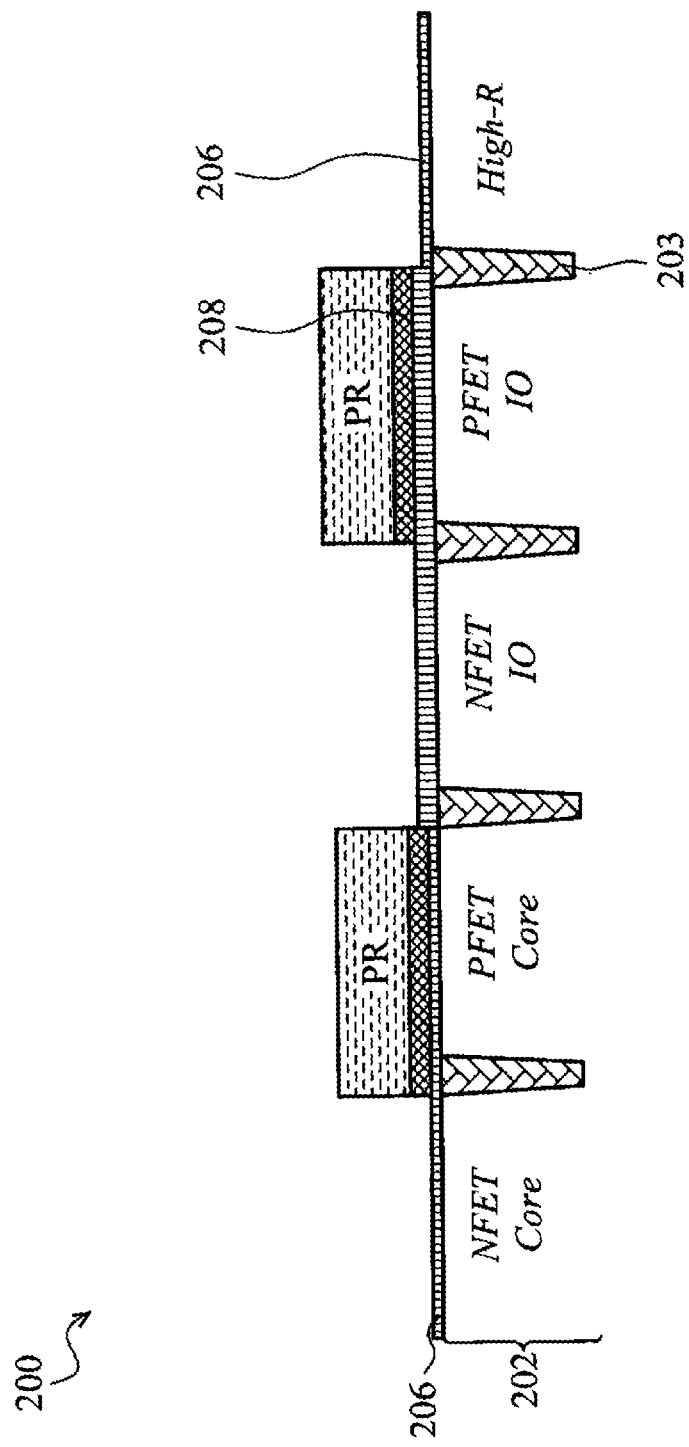

In FIG. 4, the capping layer 208 is patterned using a lithography process so as to remove the capping layer 208 from the nFET core region, nFET IO region, and high-resistor region of the substrate 202. An exemplary lithography process may include photoresist patterning, developing, and photoresist stripping. In this process, a patterned photoresist layer is formed on capping layer 208. The patterned photoresist layer includes various openings that expose portions of the capping layer 208 to subsequent etch. The etching process includes a dry etch, a wet etch, or a combination of dry etch and wet etch. The dry etching process may implement a, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BC_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile.

Figure 5:
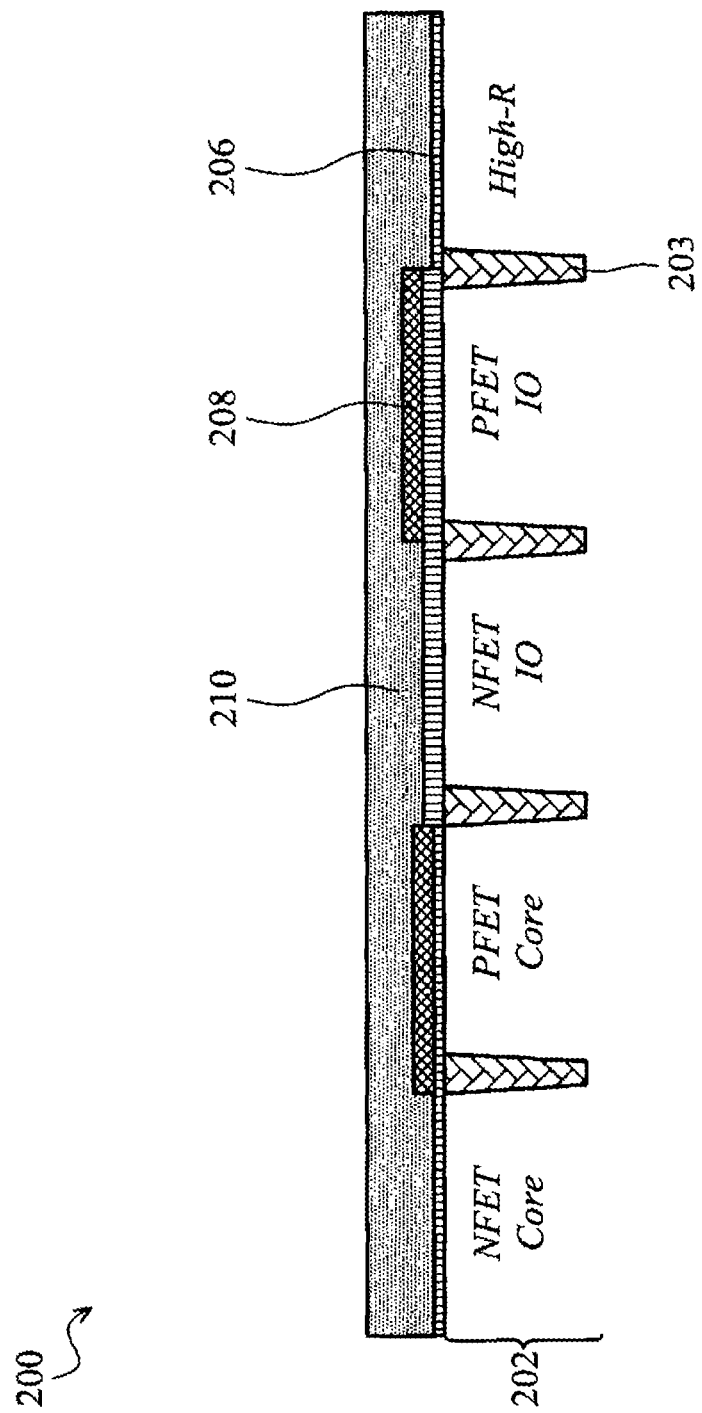

In FIG. 5 and step 110, a capping layer of a second material 210 is deposited on the interfacial layer 206 in the nFET core region, nFET IO region, and high-resistor region, and on the capping layer of the first material 208 in the pFET core region and pFET IO region. The capping layer 210 may include an n-type work function metal or oxide, including $La_2O_3$, $Sc_2O_3$, $Y_2O_3$, SrO, BaO, $Ta_2O_5$, $TiO_2$, $LaAlO_3$, $ZrO_2$, $Gd_2O_3$, or mixtures thereof. In the present embodiment, capping layer 210 includes lanthanum oxide. The capping layer 210 is formed by a suitable technique, such as ALD, CVD, or PVD. In one embodiment, the capping layer 210 has a thickness of less than 50 angstroms.

Figure 6:
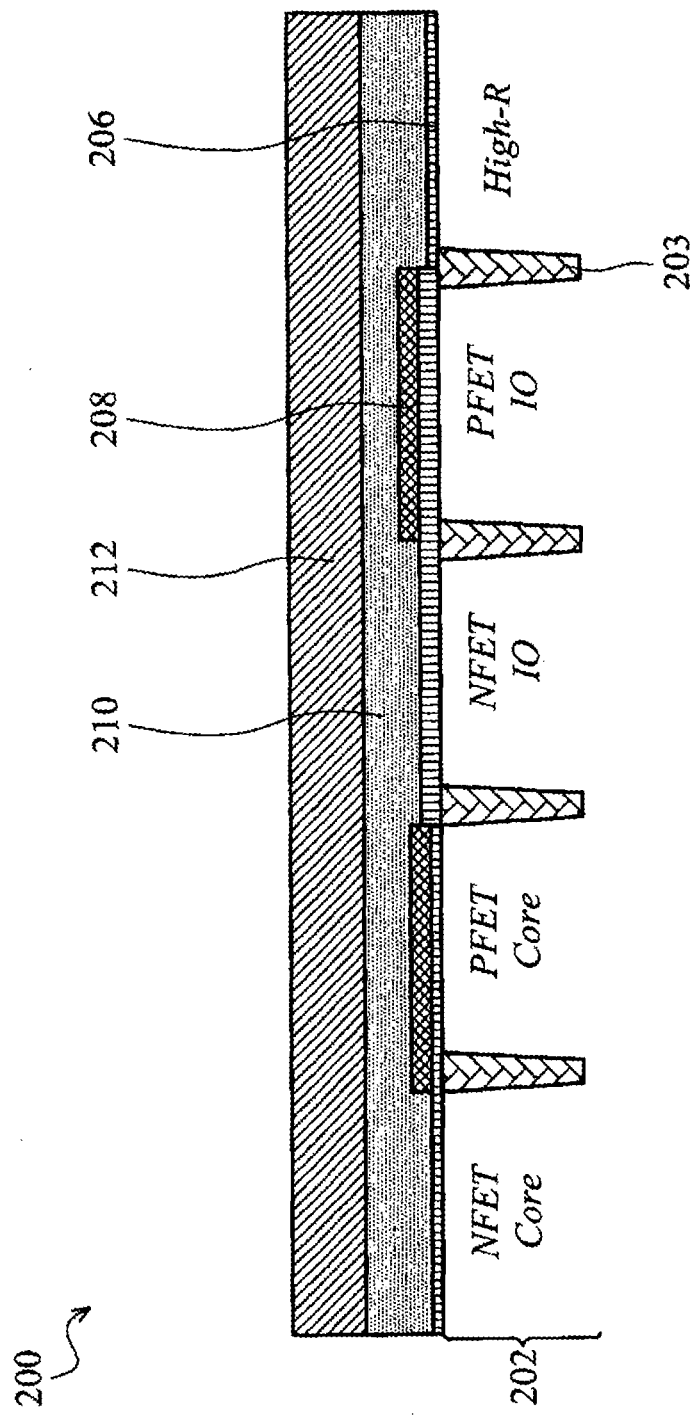

Proceeding to step 112 and FIG. 6, a high-k (HK) dielectric layer 212 is deposited on the capping layer 210. The HK dielectric layer 212 may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The HK dielectric layer 212 is formed by a suitable process such as ALD, PVD, or CVD. Other methods to form the HK dielectric layer 212 include metal organic chemical vapor deposition (MOCVD) or UV-Ozone Oxidation or molecular beam epitaxy (MBE). In one embodiment, the HK dielectric layer 212 has a thickness of less than 50 angstroms.

Figure 7:
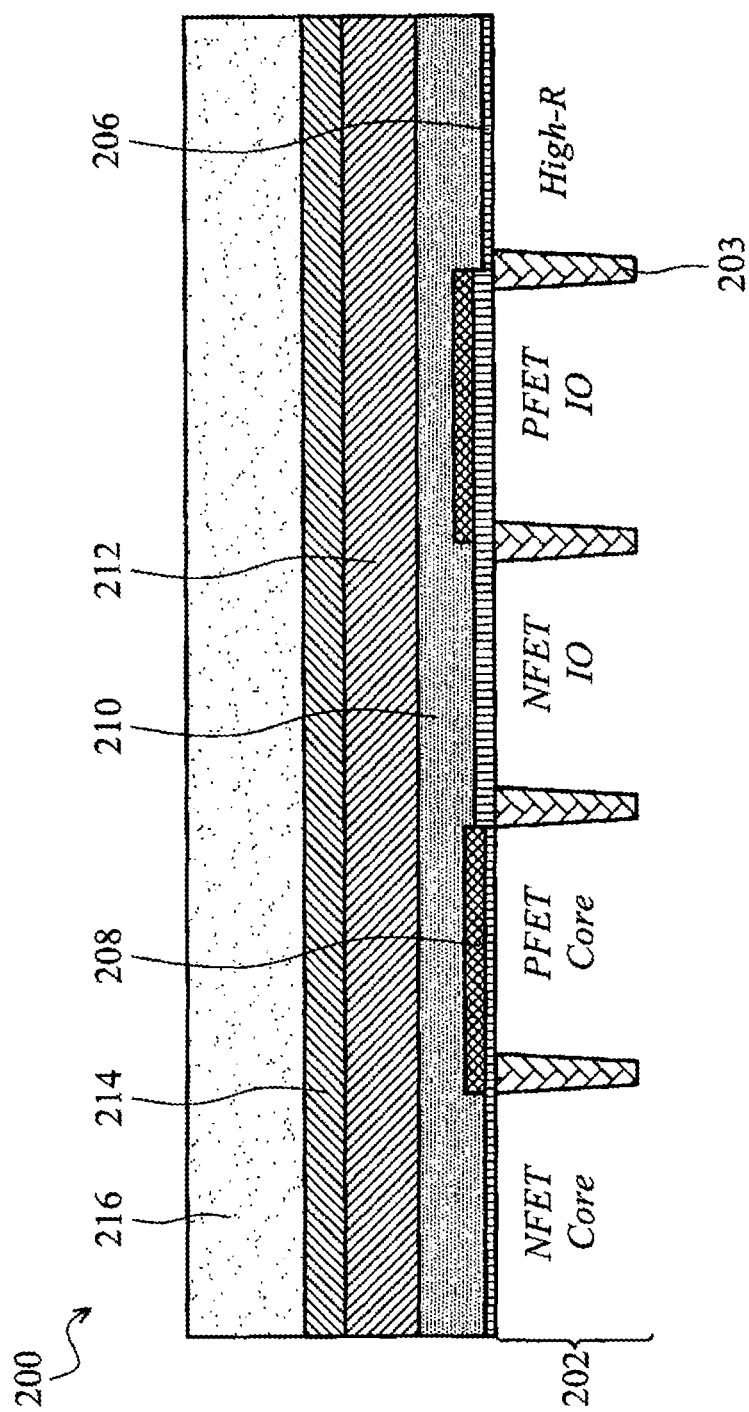

Referring now to FIG. 7 and step 114, a work function (WF) metal layer 214 is deposited on the HK dielectric layer 212 and a polysilicon layer 216 is deposited on the WF metal layer 214. In the present embodiment, the WF metal layer 214 includes titanium nitride (TiN) formed by a suitable technique, such as PVD, ALD, or CVD. In other embodiments, the WF metal layer 214 includes tantalum nitride (TaN), tungsten nitride (WN), or combinations thereof. In one embodiment, the WF metal layer 214 has a thickness of less than 200 angstroms.

The polysilicon (or amorphous silicon) layer 216 may be formed by CVD with precursor silane ($SiH_4$) or other silicon based precursor. The deposition of the amorphous silicon may be performed at a raised temperature. In one example, the deposition temperature is greater than about 400° C. The polysilicon (or amorphous) layer 216 may be in situ doped using the precursor including dopant-containing gas according to one embodiment.

Figure 8:
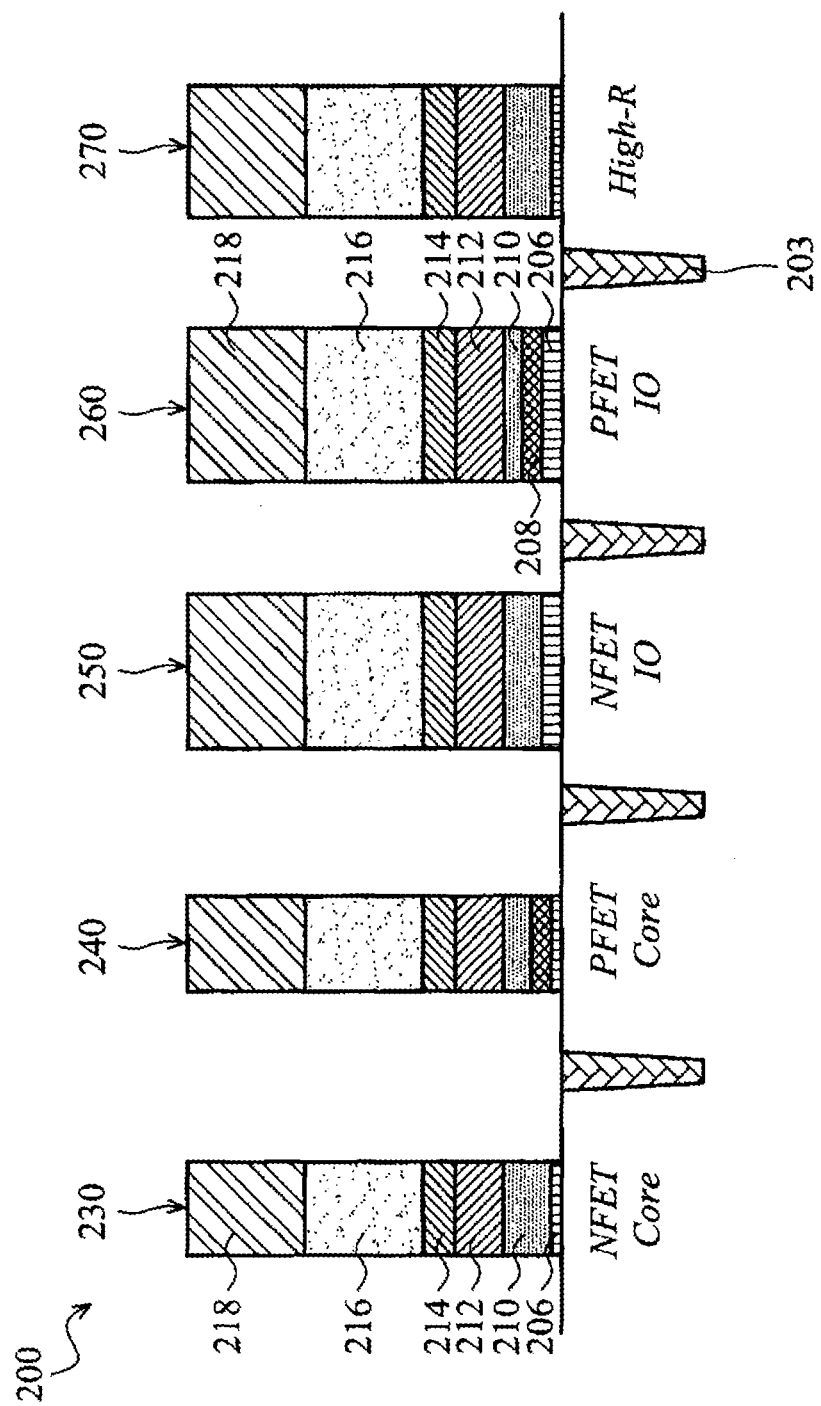
Figure 9:
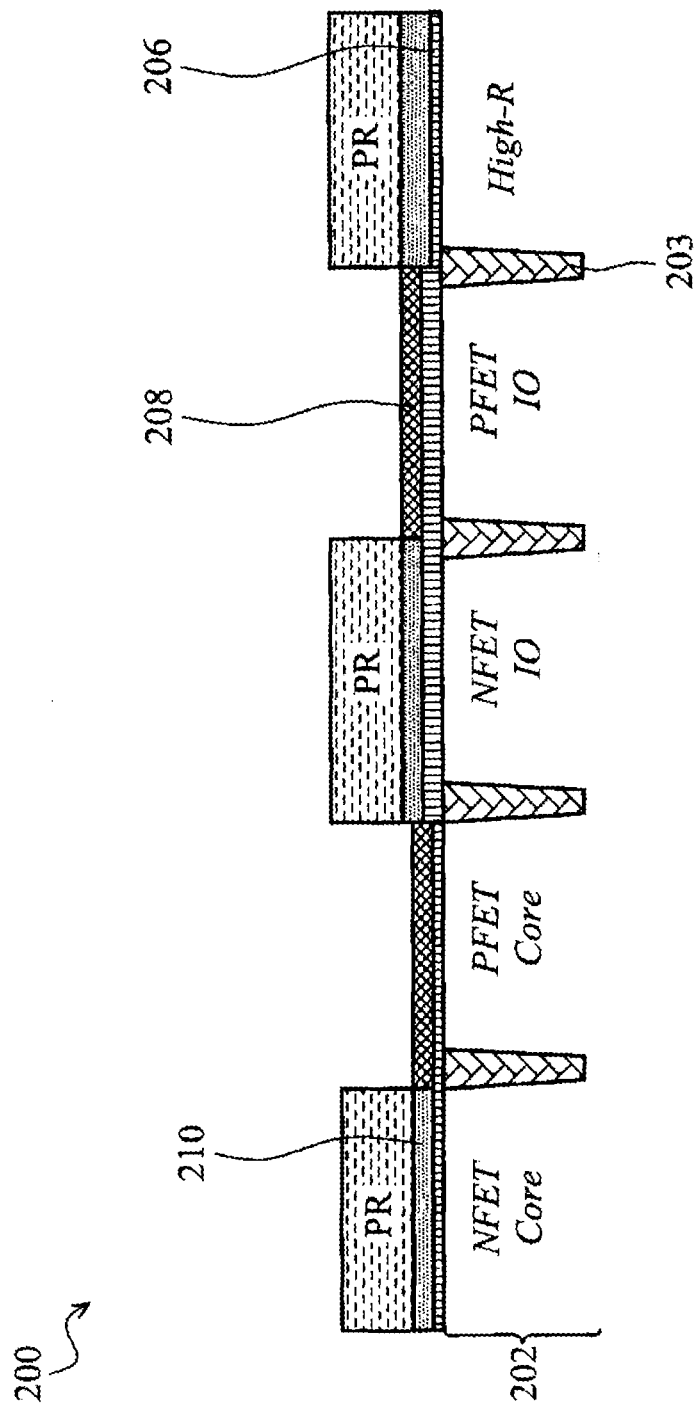
FIGS. 9-12 are sectional view of another embodiment of a semiconductor device having various gate stacks at various fabrication stages constructed according to various aspects of the present disclosure.

The method 100 proceeds to step 116 by forming the different gate stacks by a patterning and etching process. In FIG. 8, the gate layers are patterned to form five different gate stacks including a first gate stack 230 on the nFET core region, a second gate stack 240 on the pFET core region, a third gate stack 250 on the nFET IO region, a fourth gate stack 260 on the pFET IP region, and a fifth gate stack 270 on the high-resistor region. In the present embodiment, the first gate stack 230 includes, in order from bottom to top, interfacial layer 206, capping layer of the second material 210, HK dielectric layer 212, WF metal layer 214, and polysilicon layer 216. The second gate stack 240 includes, in order from bottom to top, include interfacial layer 206, capping layer of the first material 208, capping layer of the second material 210, HK dielectric layer 212, WF metal layer 214, and polysilicon layer 216. The third gate stack 250 includes, in order from bottom to top, dielectric layer 204 (not shown), interfacial layer 206, capping layer of the second material 210, HK dielectric layer 212, WF metal layer 214, and polysilicon layer 216. The fourth gate stack 260 includes, in order from bottom to top, dielectric layer 204 (not shown), interfacial layer 206, capping layer of the first material 208, capping layer of the second material 210, HK dielectric layer 212, WF metal layer 214, and polysilicon layer 216. The fifth gate stack 270 includes, in order from bottom to top, interfacial layer 206, capping layer of the second material 210, HK dielectric layer 212, WF metal layer 214, and polysilicon layer 216.

The patterning process to form the gate stacks includes lithography patterning and etching processes. For example, the lithography patterning process includes forming a patterned photoresist, developing a photoresist, and photoresist stripping. In another embodiment, as seen in FIG. 8, the etching process may further use a hard mask layer 218 as an etch mask. In this case, a hard mask layer 218 is formed on the gate layers, a patterned photoresist layer (not shown) is formed on the hard mask layer 218, a first etch process is applied to the hard mask layer 218 to transfer the pattern from the patterned photoresist to the hard mask layer 218, and a second etch process is applied to the gate layers using the patterned hard mask as an etch mask. The hard mask layer 218 may include silicon nitride and/or silicon oxide.

As seen in FIG. 8, the second and fourth gate stacks 240, 260 on the pFET core and pFET IO regions respectively, include both capping layers of the first and second material 208, 210. The capping layer of the first material 208, which may have the p-type work function is in closer proximity to the substrate 202. The capping layer of the second material 210, which may have the n-type work function, is above capping layer 208, and farther from the substrate 202.

Figure 10:
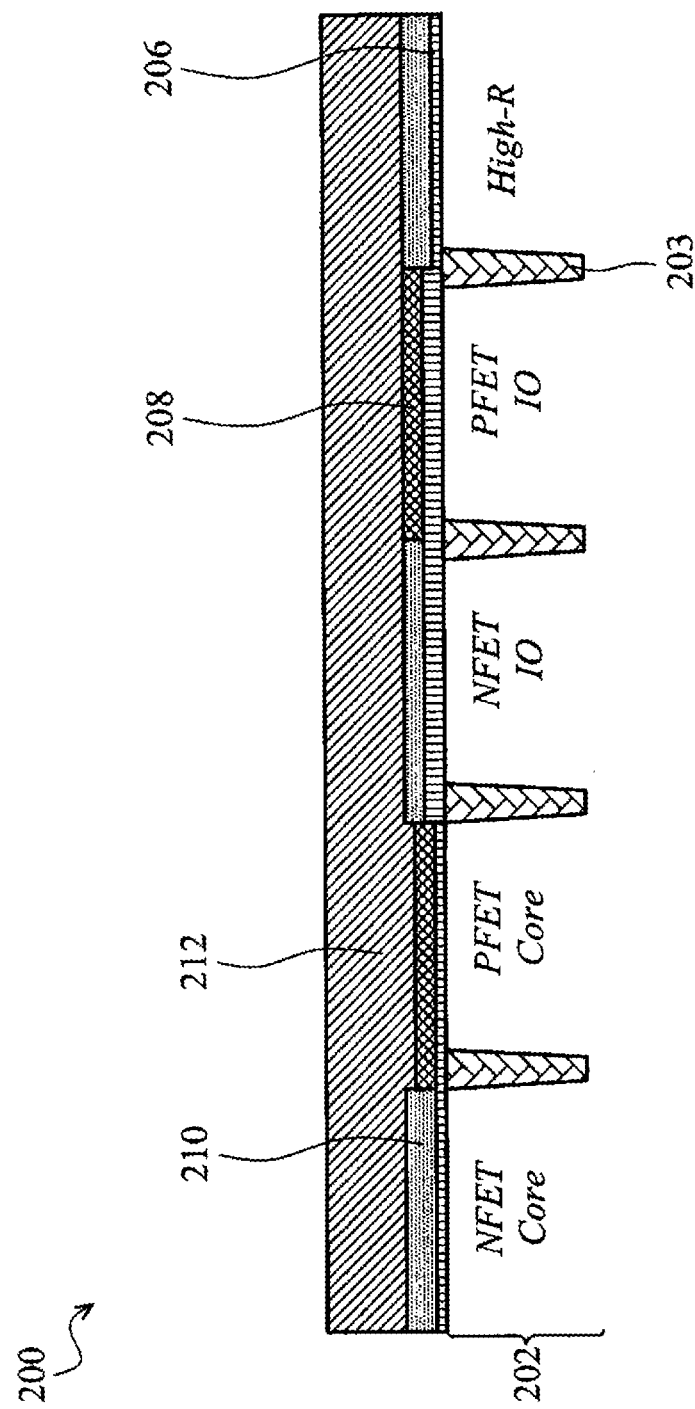
Figure 11:
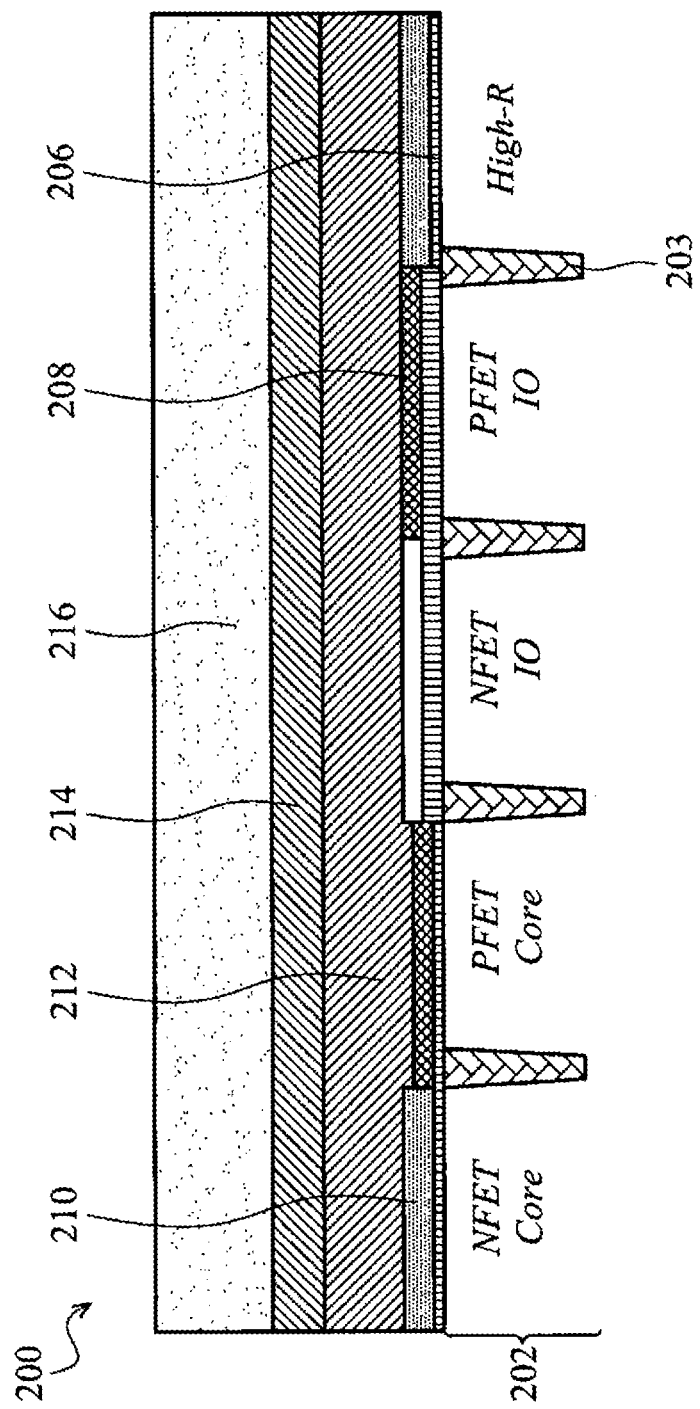

FIGS. 9 to 12 illustrate another embodiment of a method of making a semiconductor device 200. In this embodiment, an seen in FIG. 9, extra steps are included. Before depositing the HK dielectric layer 212 in step 112, the capping layer of the second material 210 is removed from the pFET core region and pFET IO region using a photolithography and etching processes. The steps following this additional step (deposition of the HK dielectric layer 212, WF metal layer 214, and polysilicon layer 216) are substantially the same as those previously described for FIGS. 6 and 7, and are shown in FIGS. 10 and 11.

Figure 12:
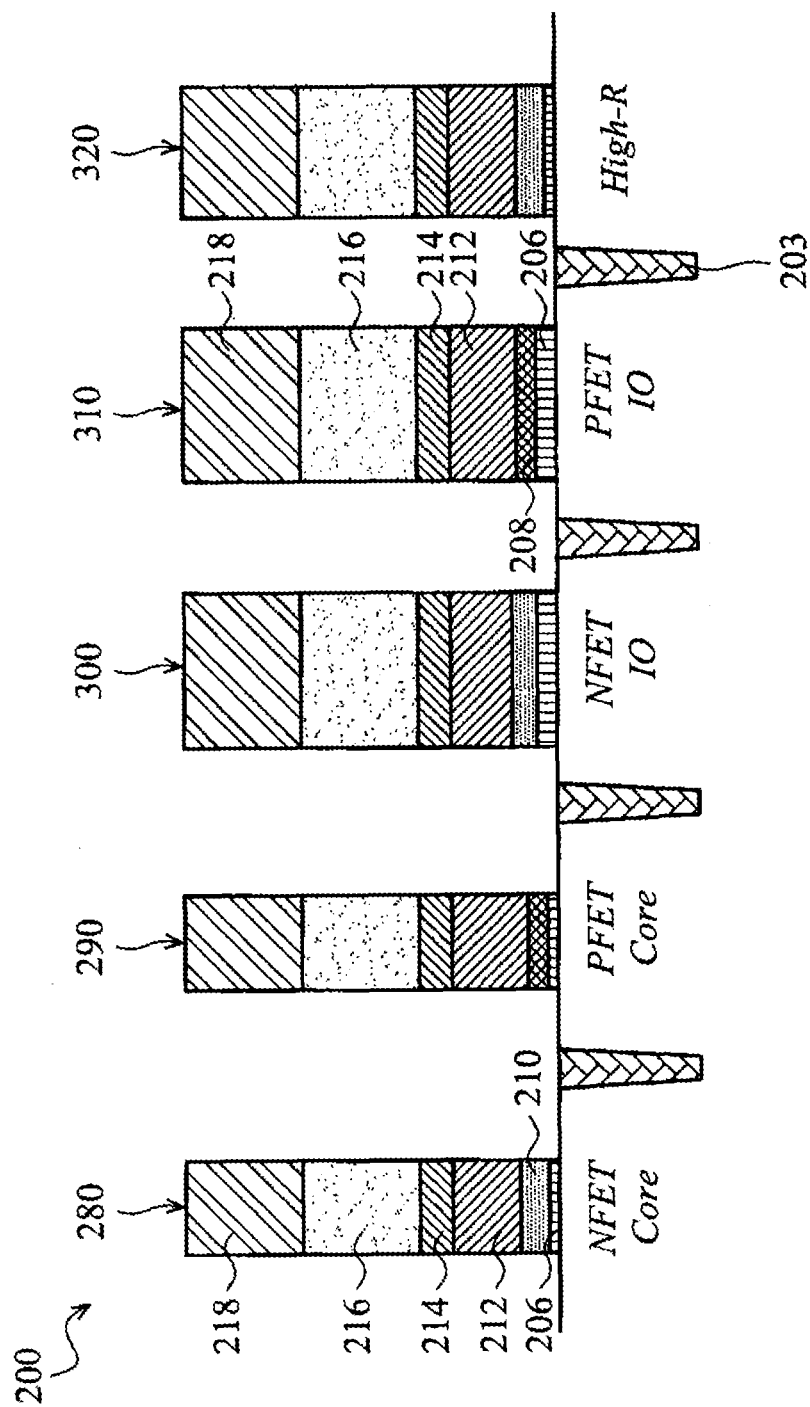

FIG. 12 illustrates the fabrication of the different gate stacks by a patterning and etching process. Similar to FIG. 8, the gate layers are patterned to form five different gate stacks including a first gate stack 280 on the nFET core region, a second gate stack 290 on the pFET core region, a third gate stack 300 on the nFET IO region, a fourth gate stack 310 on the pFET IP region, and a fifth gate stack 320 on the high-resistor region.

In the present embodiment, the first gate stack 280 includes, in order from bottom to top, interfacial layer 206, capping layer of the second material 210, HK dielectric layer 212, WF metal layer 214, and polysilicon layer 216. The second gate stack 290 includes, in order from bottom to top, interfacial layer 206, capping layer of the first material 208, HK dielectric layer 212, WF metal layer 214, and polysilicon layer 216. The third gate stack 300 includes, in order from bottom to top, dielectric layer 204 (not shown), interfacial layer 206, capping layer of the second material 210, HK dielectric layer 212, WF metal layer 214, and polysilicon layer 216. The fourth gate stack 310 includes, in order from bottom to top, dielectric layer 204 (not shown), interfacial layer 206, capping layer of the first material 208, HK dielectric layer 212, WF metal layer 214, and polysilicon layer 216. The fifth gate stack 320 includes, in order from bottom to top, interfacial layer 206, capping layer of the second material 210, HK dielectric layer 212, WF metal layer 214, and polysilicon layer 216.

Referring now to FIG. 13, another embodiment of method 100 is described. The method 100 proceeds through steps 102-106 as previously described with reference to FIGS. 1-2. In this embodiment, the method is substantially the same as the method described with respect to FIGS. 3-7, except that the positions of the capping layer of the first material 208 and capping layer of the second material 210 in the process flow are reversed. For example, FIG. 13 is the same as FIG. 3, but capping layer 210 is deposited first instead of capping layer 208. The method proceeds through steps 108-114 are previously described. Also, in this embodiment, the capping layer 210 is removed from the pFET core and pFET IO regions instead of from the nFET core and nFET IO regions as was the case for capping layer 208 in FIG. 4.

At step 116 and FIG. 14, different gate stacks are formed by a patterning and etching process as previously described. The gate layers are patterned to form five different gate stacks including a first gate stack 330 on the nFET core region, a second gate stack 340 on the pFET core region, a third gate stack 350 on the nFET IO region, a fourth gate stack 360 on the pFET IO region, and a fifth gate stack 370 on the high-resistor region.

In the present embodiment, the first gate stack 330 includes, in order from bottom to top, interfacial layer 206, capping layer of the second material 210, capping layer of the first material 208, HK dielectric layer 212, WF metal layer 214, and polysilicon layer 216. The second gate stack 340 includes, in order from bottom to top, interfacial layer 206, capping layer of the first material 208, HK dielectric layer 212, WF metal layer 214, and polysilicon layer 216. The third gate stack 350 includes, in order from bottom to top, dielectric layer 204 (not shown), interfacial layer 206, capping layer of the second material 210, capping layer of the first material 208, HK dielectric layer 212, WF metal layer 214, and polysilicon layer 216. The fourth gate stack 360 includes, in order from bottom to top, dielectric layer 204 (not shown), interfacial layer 206, capping layer of the first material 208, HK dielectric layer 212, WF metal layer 214, and polysilicon layer 216. The fifth gate stack 370 includes, in order from bottom to top, interfacial layer 206, capping layer of the first material 208, HK dielectric layer 212, WF metal layer 214, and polysilicon layer 216.

As seen in FIG. 14, the first and third gate stacks 330, 350 on the nFET core and nFET IO regions respectively, include both capping layers of the first and second material 208, 210. The capping layer of the second material 210, which may have the n-type work function is in closer proximity to the substrate 202. The capping layer of the first material 208, which may have the p-type work function, is above the capping layer 210, and farther from the substrate 202.

FIGS. 15-16 illustrate another embodiment of a method of making a semiconductor device 200. In this embodiment, the method is substantially the same as the method described with respect to FIGS. 9-11, except that the positions of the capping layer of the first material 208 and capping layer of the second material 210 in the process flow are reversed. Also, in this embodiment, the capping layer 208 is removed from the nFET core and pFET core regions instead of from the pFET core and pFET IO regions as was the case for capping layer 210 in FIG. 9.

FIG. 16 illustrates the fabrication of the different gate stacks by a patterning and etching process. Similar to FIG. 14, the gate layers are patterned to form five different gate stacks including a first gate stack 380 on the nFET core region, a second gate stack 390 on the pFET core region, a third gate stack 400 on the nFET IO region, a fourth gate stack 410 on the pFET IO region, and a fifth gate stack 420 on the high-resistor region.

In the present embodiment, the first gate stack 380 includes, in order from bottom to top, interfacial layer 206, capping layer of the second material 210, HK dielectric layer 212, WF metal layer 214, and polysilicon layer 216. The second gate stack 390 includes, in order from bottom to top, interfacial layer 206, capping layer of the first material 208, HK dielectric layer 212, WF metal layer 214, and polysilicon layer 216. The third gate stack 400 includes, in order from bottom to top, dielectric layer 204 (not shown), interfacial layer 206, capping layer of the second material 210, HK dielectric layer 212, WF metal layer 214, and polysilicon layer 216. The fourth gate stack 410 includes, in order from bottom to top, dielectric layer 204 (not shown), interfacial layer 206, capping layer of the first material 208, HK dielectric layer 212, WF metal layer 214, and polysilicon layer 216. The fifth gate stack 420 includes, in order from bottom to top, interfacial layer 206, capping layer of the first material 208, HK dielectric layer 212, metal layer 214, and polysilicon layer 216.

Various advantages may be present in one or more embodiments of the method 100 and the semiconductor device 200. The present disclosure provides a new integration scheme for a gate first process design. The methods provide four kinds of process flows that may be used to fabricate various kinds of semiconductor devices. The methods are flexible because they allow different devices to be fabricated by changing the sequence of the n/p capping layer deposition and patterning. The methods are efficient because a variety of gate stacks can be formed at the same time, i.e., layers of the same material for each gate stack are deposited at the same time. The present methods and devices provide a feasible integration flow that can integrate CMOS devices with Core/IO/Resistors and maintain the reasonable threshold voltage of NMOS and PMOS at the same time.

One of the broader forms of the present disclosure relates to a semiconductor device. The device includes a substrate and isolation features to separate different regions on the substrate. The device further includes five different gate stacks on the different regions. A p-type field-effect transistor (pFET) core region has a first gate stack on the substrate that includes an interfacial layer, a capping layer of a first material on the interfacial layer, and a high k (HK) dielectric layer on the capping layer of the first material. An input/output pFET (pFET IO) region has a second gate stack that includes a dielectric layer, an interfacial layer on the dielectric layer, a capping layer of a first material on the interfacial layer, and a high k (HK) dielectric layer on the capping layer of the first material. An n-type field-effect transistor (nFET) core region has a third gate stack on the substrate that includes an interfacial layer, a capping layer of the second material on the interfacial layer, and a HK dielectric layer on the capping layer of the second material. An input/output nFET (nFET IO) region has a fourth gate stack that includes a dielectric layer, an interfacial layer on the dielectric layer, a capping layer of the second material on the interfacial layer, and a HK dielectric layer on the capping layer of the second material. A high-resistor region has a fifth gate stack that includes an interfacial layer, a capping layer of the second material on the interfacial layer, and a HK dielectric layer on the capping layer of the second material.

Another one of the broader forms of the present disclosure involves another semiconductor device. The device includes a semiconductor substrate and isolation features to separate different regions on the substrate. The device further includes five different gate stacks on the different regions. A p-type field-effect transistor (pFET) core region has a first gate stack that includes an interfacial layer, a capping layer of a first material on the interfacial layer, and a high k (HK) dielectric layer on the capping layer of the first material. An input/output pFET (pFET IO) region has a second gate stack that includes a dielectric layer, an interfacial layer on the dielectric layer, a capping layer of a first material on the interfacial layer, and a HK dielectric layer on the capping layer of the first material. A high-resistor has a third gate stack that includes an interfacial layer, a capping layer of a first material on the interfacial layer, and a HK dielectric layer on the capping layer of the first material. An n-type field-effect transistor (nFET) core region has a fourth gate stack that includes an interfacial layer, a capping layer of the second material on the interfacial layer, and a HK dielectric layer on the capping layer of the second material. An input/output nFET (nFET IO) region has a fifth gate stack that includes a dielectric layer, an interfacial layer on the dielectric layer, a capping layer of the second material on the interfacial layer, and a HK dielectric layer on the capping layer of the second material.

The present disclosure also describes a method of fabricating a semiconductor device. The method includes providing a semiconductor substrate having regions for an n-type field-effect transistor (nFET) core, an input/output nFET (nFET IO), a p-type field-effect transistor (pFET) core, an input/output pFET (pFET IO), and a high-resistor, forming an oxide layer on the IO region of the substrate, forming an interfacial layer on the substrate and the oxide layer, depositing a capping layer of a first material on the interfacial layer, depositing a capping layer of a second material on the interfacial layer and on the capping layer of the first material, depositing a high-k (HK) dielectric layer on the capping layer of the second material, depositing a work function metal layer on the HK dielectric layer, depositing a polysilicon layer on the metal layer, and forming gate stacks on the regions of the substrate.

Other process steps may be implemented before, during and/or after the method 100. The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a semiconductor substrate;
isolation features to separate different regions on the substrate;
a p-type field-effect transistor (pFET) core region having a first gate stack on the substrate, the first gate stack including an interfacial layer, a high k (HK) dielectric layer, and a capping layer of a first material and a capping layer of a second material disposed between the interfacial layer and the HK dielectric layer, the first material comprises a p-type metal oxide and the second material comprises an n-type metal oxide, and wherein the capping layer of the second material is directly on the capping layer of the first material and wherein the capping layer of the first material and the capping layer of the second material have a combined first thickness, and wherein the capping layer of the second material in the pFET core region has a first capping layer thickness;
an input/output pFET (pFET IO) region having a second gate stack on the substrate, the second gate stack including an interfacial layer, a HK dielectric layer, and a capping layer of the first material between the interfacial layer and the HK dielectric layer, wherein the interfacial layer of the second gate stack has a thickness that is greater than a thickness of the interfacial layer in the first gate stack, and wherein a capping layer of the second material in the pFET region has a second capping layer thickness that is smaller than the first capping layer thickness;
an n-type field-effect transistor (nFET) core region having a third gate stack on the substrate, the third gate stack including an interfacial layer, a HK dielectric layer directly on a capping layer of the second material, and wherein the capping layer of the second material in the nFET core region has a third capping layer thickness that is equal to the combined first thickness;
an input/output nFET (nFET IO) region having a fourth gate stack on the substrate, the fourth gate stack including an interfacial layer, a capping layer of the second material on the interfacial layer, and a HK dielectric layer directly on the capping layer of the second material, wherein the capping layer of the second material in the nFET IO region has a fourth capping layer thickness that is greater than the first capping layer thickness and smaller than the third capping layer thickness; and
a high-resistor region having a fifth gate stack on the substrate, the fifth gate stack including an interfacial layer, a capping layer of the second material on the interfacial layer, and a HK dielectric layer directly on the capping layer of the second material.

2. The device of claim 1, wherein the second gate stack further comprises a capping layer of the second material above the capping layer of the first material.

3. The device of claim 2, wherein the HK dielectric layer of the second gate stack is above the capping layer of the second material.

4. The semiconductor device of claim 2, wherein a thickness of the capping layer of the second material in the fourth gate stack is equal to a combined thickness of the capping layers of the first and second materials in the second gate stack.

5. The device of claim 1, wherein the p-type metal oxide comprises MgO, CaO, or mixtures thereof, and the n-type metal oxide comprises SrO, BaO, LaAlO$_3$, Gd$_2$O$_3$, or mixtures thereof.

6. The device of claim 1, wherein the first material comprises MgO, CaO, or mixtures thereof and the second material is BaO.

7. The device of claim 1, wherein each of the second and fourth gate stacks is wider than each of the first and third gate stacks.

8. A semiconductor device, comprising:
a semiconductor substrate;
isolation features to separate different regions on the substrate;
a p-type field-effect transistor (pFET) core region having a first gate stack on the substrate, the first gate stack including an interfacial layer, a high k (HK) dielectric layer, and a capping layer of a first material and a capping layer of a second material disposed between the interfacial layer and the HK dielectric layer, and wherein the capping layer of the second material is directly on the capping layer of the first material and wherein the capping layer of the first material and the capping layer of the second material have a combined first thickness, and wherein the capping layer of the second material in the pFET core region has a first capping layer thickness;
an input/output pFET (pFET IO) region having a second gate stack on the substrate, the second gate stack including an interfacial layer, a HK dielectric layer, and a capping layer of the first material between the interfacial layer and the HK dielectric layer, wherein the interfacial layer of the second gate stack has a thickness that is greater than a thickness of the interfacial layer in the first gate stack, and wherein a capping layer of the second material in the pFET TO region has a second capping layer thickness that is smaller than the first capping layer thickness;
an n-type field-effect transistor (nFET) core region having a third gate stack on the substrate, the third gate stack including an interfacial layer, a HK dielectric layer directly on a capping layer of the second material, and wherein the capping layer of the second material in the nFET core region has a third capping layer thickness that is equal to the combined first thickness;
an input/output nFET (nFET TO) region having a fourth gate stack on the substrate, the fourth gate stack including an interfacial layer, a capping layer of the second material on the interfacial layer, and a HK dielectric layer directly on the capping layer of the second material, wherein the capping layer of the second material in the nFET TO region has a fourth capping layer thickness that is greater than the first capping layer thickness and smaller than the third capping layer thickness; and
a high-resistor region having a fifth gate stack on the substrate, the fifth gate stack including an interfacial layer, a capping layer of the second material on the interfacial layer, and a HK dielectric layer directly on the capping layer of the second material,
wherein in both the pFET TO and pFET core regions, the capping layer of the second material is disposed between the capping layer of the first material and the HK layer such that the capping layer of the first material and the HK layer are not in direct contact.

9. A semiconductor device, comprising:
a semiconductor substrate having regions for a core p-type field-effect transistor (pFET) region and an input/output pFET (pFET TO) region;
an interfacial layer on the substrate in each of the pFET TO region and the pFET core region;
in the pFET TO region, a capping layer of a first material on the interfacial layer and a capping layer of a second material on the interfacial layer and directly on the capping layer of the first material, the capping layers of the first and second materials in the pFET TO region having a first combined thickness, wherein the capping layer of the second material in the pFET TO region has a first capping layer thickness;
in the pFET core region, a capping layer of the first material on the interfacial layer and a capping layer of the second material on the interfacial layer and directly on the capping layer of the first material, the capping layers of the first and second materials in the pFET core region having a second combined thickness that is different than from the first combined thickness, wherein the capping layer of the second material in the pFET core region has a second capping layer thickness that is greater than the first capping layer thickness;
in both the pFET TO region and the pFET core region, a high-k (HK) dielectric layer directly on the capping layer of the second material, wherein the capping layer of the second material and the capping layer of the first material are between the interfacial layer and the HK dielectric layer;
a work function metal layer on the HK dielectric layer; and
a polysilicon layer on the metal layer,
wherein the first material comprises a p-type metal oxide and the second material comprises an n-type metal oxide.

10. The semiconductor device of claim 9, wherein the semiconductor substrate has additional regions for a core n-type field-effect transistor (nFET), and an input/output nFET (nFET TO).

11. The semiconductor device of claim 10, wherein gate stacks of the core nFET and the nFET TO comprise a capping layer of the second material between an interfacial layer and an HK dielectric layer, wherein the capping layer of the second material in the core nFET region has a third capping layer thickness and the capping layer of the second material in the nFET TO region has a fourth capping layer thickness that is greater than the second capping layer thickness and smaller than the third capping layer thickness.

12. The device of claim 11, further comprising a dielectric layer between the semiconductor substrate and the interfacial layer in the pFET IO and nFET IO regions.

13. The device of claim 12, wherein the dielectric layer comprises chemical oxide.

14. The semiconductor device of claim 9, wherein the p-type metal oxide comprises MgO, CaO, or mixtures thereof and the n-type metal oxide comprises SrO, BaO, $LaAlO_3$, $Gd_2O_3$, or mixtures thereof.

15. The semiconductor device of claim 9, further comprising a high-resistor region having a resistor stack on the substrate, the resistor stack including an interfacial layer, a capping layer of the second material on the interfacial layer, and a HK dielectric layer on the capping layer of the second material.

16. The device of claim 9, wherein the first material comprises MgO, CaO, or mixtures thereof and the second material is BaO.

* * * * *